(12) United States Patent
Battaglia et al.

(10) Patent No.: US 11,670,729 B2
(45) Date of Patent: Jun. 6, 2023

(54) SOLAR CELL APPARATUS AND METHOD FOR FORMING THE SAME FOR SINGLE, TANDEM AND HETEROJUNCTION SYSTEMS

(71) Applicant: 3Sun S.r.l., Catania (IT)

(72) Inventors: Anna Battaglia, Catania (IT); Cosimo Gerardi, Catania (IT); Giuseppe Condorelli, Catania (IT); Andrea Canino, Catania (IT)

(73) Assignee: Sun S.R.L., Catania (IT)

( * ) Notice: Subject to any disclaimer, the term of this patent is extended or adjusted under 35 U.S.C. 154(b) by 189 days.

(21) Appl. No.: 16/478,847

(22) PCT Filed: Jan. 17, 2018

(86) PCT No.: PCT/EP2018/051131
§ 371 (c)(1),
(2) Date: Jul. 18, 2019

(87) PCT Pub. No.: WO2018/134269
PCT Pub. Date: Jul. 26, 2018

(65) Prior Publication Data
US 2021/0296522 A1    Sep. 23, 2021

(30) Foreign Application Priority Data
Jan. 18, 2017   (IT) .................. 102017000004876

(51) Int. Cl.
*H01L 31/077*   (2012.01)
*H01L 31/0224*  (2006.01)
(Continued)

(52) U.S. Cl.
CPC ...... *H01L 31/077* (2013.01); *H01L 31/02363* (2013.01); *H01L 31/022466* (2013.01);
(Continued)

(58) Field of Classification Search
None
See application file for complete search history.

(56) References Cited

U.S. PATENT DOCUMENTS 4,843,451 A   6/1989  Watanabe
6,100,466 A * 8/2000  Nishimoto ............ C23C 16/509
                                                136/258

(Continued)

FOREIGN PATENT DOCUMENTS

JP  2011-23526 A   2/2011
JP  2011-159628 A  8/2011
(Continued)

OTHER PUBLICATIONS

Written Opinion and International Search Report in PCT/EP2018/051131 dated Feb. 12, 2018.
(Continued)

*Primary Examiner* — Eli S Mekhlin
(74) *Attorney, Agent, or Firm* — Kristina Castellano; Castellano PLLC (57) ABSTRACT

A solar cell apparatus 100 and a method for forming said solar cell apparatus 100, comprising a substrate 101, a n-type transparent conductive oxide (TCO) layer 102 deposited atop said substrate 101, a p-i-n structure 200 that includes a p-type layer 103, an i-type layer 104, a n-type layer 105, a metal back layer 106 deposited atop said n-type layer 105 of the p-i-n structure 200. The n-type layer 105 comprises n-type donors 115 including phosphorus atoms. The n-type donors 115 include oxygen atoms at an atomic concentration comprised between 5% and 25% of the overall atomic composition of the n-type layer 105.

8 Claims, 10 Drawing Sheets

(51) Int. Cl.
- *H01L 31/0236* (2006.01)
- *H01L 31/0368* (2006.01)
- *H01L 31/075* (2012.01)
- *H01L 31/076* (2012.01)
- *H01L 31/18* (2006.01)

(52) U.S. Cl.
CPC ...... *H01L 31/03685* (2013.01); *H01L 31/075* (2013.01); *H01L 31/076* (2013.01); *H01L 31/1824* (2013.01); *H01L 31/1884* (2013.01)

(56) References Cited

U.S. PATENT DOCUMENTS

| | | | | |
|---|---|---|---|---|
| 2001/0017153 | A1* | 8/2001 | Kubota | H01L 31/046 136/256 |
| 2003/0168660 | A1* | 9/2003 | Terakawa | H01L 31/077 257/E31.048 |
| 2009/0133753 | A1* | 5/2009 | Sasaki | H01L 31/075 136/261 |
| 2010/0200052 | A1* | 8/2010 | Yamashita | C23C 14/086 136/255 |
| 2011/0272012 | A1* | 11/2011 | Heng | H01L 31/1804 438/96 |
| 2012/0319157 | A1* | 12/2012 | Ichuo | H01L 31/0236 257/E31.124 |

FOREIGN PATENT DOCUMENTS

| | | |
|---|---|---|
| JP | 2012-36528 A | 2/2012 |
| JP | 2013-41955 A | 2/2013 |
| JP | 2013-106456 A | 5/2013 |
| WO | 2013-031906 A1 | 3/2013 |

OTHER PUBLICATIONS

He Yuping et al "a-SiOx:H passivation layers for Cz-Si wafer deposited by hot wire chemical vapor deposition", Materials Science in Semiconductor Processing, vol. 61, pp. 1-4, Jan. 4, 2017.
First Office Action in corresponding Japanese Patent application (2019-559394) dated Jun. 14, 2022, and English translation thereof.
First Office Action in corresponding Chinese Patent application 201880013678X dated Jul. 1, 2022 and English translation of cover page.

* cited by examiner

SOLAR CELL APPARATUS AND METHOD FOR FORMING THE SAME FOR SINGLE, TANDEM AND HETEROJUNCTION SYSTEMS

CROSS REFERENCE TO RELATED APPLICATIONS

This application is a U.S. National Stage application of PCT/EP2018/051131 filed on Jan. 17, 2018, which claims priority to Italian patent application 102017000004876 filed on Jan. 18, 2017, the contents of both of which are incorporated herein by reference.

FIELD OF THE INVENTION

The present invention relates to a solar cell apparatus of the type comprising a doped p-i-n structure and a method for forming the same.

BACKGROUND OF THE INVENTION

Solar cell apparatuses are largely diffused and world widely utilized as electrical devices capable of converting the energy of light directly into electricity by the photovoltaic effect. P-i-n structures based on doped silicon semiconductors and transparent conductive oxides (TCO) are typical and fundamental components of these devices comprising a p-type silicon based semiconductor region (e.g. p-type layer), a n-type silicon based semiconductor region (e.g. n-type layer) and a lightly doped "near" intrinsic silicon based semiconductor region (e.g. i-type layer). TCO is extremely important as front contact for thin film solar cells and its optical and electrical properties determine the correct behaviour of the device. Typically, high transmittance, low resistivity and high haze are characteristics pursued to improve the performances of the solar cell apparatuses. Furthermore, the efficiency of silicon based solar cells is strongly sensitive to the transparent conducting oxide TCO used as transparent front contact: p-i-n solar cells are typically designed in a certain configuration where the p-type silicon is in direct electric contact with the front TCO.

Moreover, thin film silicon solar cells are typically based on hydrogenated amorphous silicon based structure (hereafter labeled as a-Si:H) and hydrogenated microcrystalline silicon based structure (hereafter labeled as µc-Si:H) materials. The solar cells are made by using single junctions of p-i-n a-Si:H structures or µc-Si:H structures or by tandem solar cells consisting of p-i-n a-Si:H structures top cell stacked with a p-i-n µc-Si:H structure bottom cell. From an electrical point of view, the top and bottom cells are stacked in series. The top cell has the best response in the blue-green spectral range, whereas the bottom cell has the optimized response in the red spectral range. The main doping elements used in a-Si:H structures and in µc-Si:H structures are the same as in crystalline silicon: mainly boron B is used in doping of p-type material and phosphorus P in doping of n-type material.

Typically, the doped structures are produced in the form of thin layers realized by means of common thin films apparatus such as chemical vapor deposition or physical vapor deposition.

It is known that the doped layers may produce two different and interesting effects in the a-Si:H and in the µc-Si:H solar cells structures.

First, they set-up an internal electric field across the active intrinsic a-Si:H layer. The electric field is high enough to ensure that the photo-generated carriers in intrinsic a-Si:H layer are collected. The strength of the electric field depends on the level of doping in the doped layers and on the thickness of the intrinsic layer.

Figure 1:
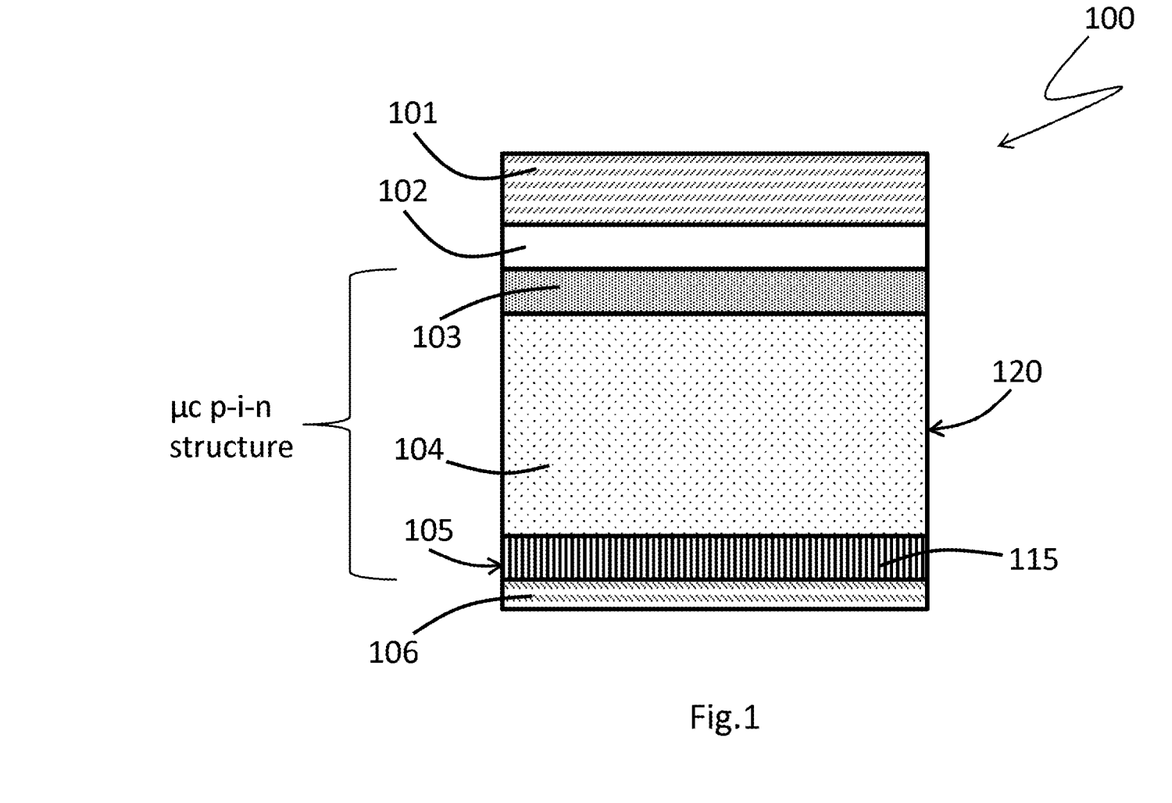
FIG. 1 is an illustrative and partial cross-sectional view of a solar cell apparatus in accordance with some embodiments of the present invention.

Second, they establish low-loss ohmic electrical contacts between the a-Si:H or µc-Si:H structures and the external electrodes. In a practical evaluation of the tunability of production process, the change in conductivity of a-Si:H and pc-Si:H structures can be achieved and controlled during deposition process phases by mixing the silicon source gas, silane ($SiH_4$), with phosphine ($PH_3$) or diborane ($B_2H_6$) during the deposition. The room temperature conductivity of a-Si:H structure as a function of fraction of doping gases in a mixture with silane is shown in FIG. 1 as it was disclosed in the article titled "Doping and the Fermi Energy in Amorphous Silicon" published by R. A. Street, Physics Review Letter 49, p. 1187, 1982.

The conductivity of a-Si:H structures could be varied by more than a factor 10. Thus, the activation energy decreases from 0.7-0.8 eV in intrinsic material to about 0.15 eV in phosphorus doped material and to about 0.3 eV in boron doped material.

It is known that the random network of the a-Si:H structure can incorporate impurity atoms, such as phosphorus and boron, with coordination number that corresponds to the bonding configuration with the lowest energy. This feature of the random network of the a-Si:H is in contrast to the crystalline structure of pc-Si:H, in which, due to the long range order, the impurity atoms are forced to adopt the coordination of the host atoms. The doping efficiency in a-Si:H, which is defined as the fraction of dopant atoms with fourfold coordination, is rather low. In comparison to single crystal silicon, where the doping efficiency at room temperature is almost unity, it is in the range of $10^{-2}$-$10^{-3}$ in a-Si:H. Hence, relatively high concentrations of phosphorous atoms must be introduced in order to obtain materials with high conductivity.

In case of n-doping in a-Si:H structures the formation of the defect-compensated donors in the case of phosphorus atoms is the major doping mechanism and it is known as the autocompensation model (as described in the previously cited article "Doping and the Fermi Energy in Amorphous Silicon"). The most important result of this model is that doping of a-Si:H structure unavoidably leads to creation of dangling bonds. As a matter of fact, the doped intrinsic a-Si:H structure has a defect density two or three orders of magnitude larger in comparison to intrinsic a-Si:H structure. Though pc-Si:H has better conduction characteristics than the a-Si:H material, it is remarkably less performing than crystalline silicon (c-Si) and polycrystalline Silicon. This is because it is typically a mixed amorphous-microcrystalline material (defining a crystallographic heterophase) consisting of silicon crystallites embedded in a-Si:H structures. Due to the presence of a-Si:H structures in the matrix, the doping efficiency of pc-Si:H structure cannot be controlled as precisely as in crystal-Si or in polycrystalline-Si. In other words, also for pc-Si:H structure it is not possible to dope the n-type layer in a completely efficient way and the increase in phosphorus concentration inside the heterogeneous µc-Si:H structure induces structure lattice architecture amorphization as well as an improvement of the defects density that increases the trapping of charge carriers.

The autocompensation model defines then apparent and typical drawbacks related to the phosphorous n-doped pc-Si:H structures: as a matter of fact, this peculiar type of n-doping significantly reduces the pc-Si:H structure efficiency as a consequence of a deleterious structure amorphization.

In the article "Passivation of oxygen-related donors in microcrystalline silicon by low temperature deposition" by Nasuno et al ii, Appl. Phys. Lett., Vol. 78, N. 16, 16 Apr. 2001, a low-temperature plasma enhanced rf deposition process for solar cell based on hydrogenated microcrystalline silicon (µc-Si:H) is described. In particular, the document deals with shunt leakage arising from oxygen-related donors that become passivated at low temperature by hydrogen passivation.

The oxygen doping and passivation is produced and analyzed in the i-type layer comprised in a p-i-n structure having an amorphous n-type layer.

In this document, no phosphorus atoms are described as donor atoms co-deposited with oxygen ones, therefore not solving problems due to microcrystalline structure amorphization and thus efficiency reduction: as a matter of facts, the proposed solar cell has an efficiency of 8.9% while the solution proposed shows an improved efficiency of 14.7%.

SUMMARY OF THE INVENTION

The scope of the invention is to provide a solar cell apparatus and a method for forming the same that overcomes the drawbacks of known solar cell apparatuses.

Within this aim, a further object of the invention is to provide a solar cell apparatus in which a n-doping effect is produced in order to increase the active donors in the structure without inducing excessive and extensive structure amorphization.

Another object of the invention is to reduce the refractive index comprised in a n-doped layer of the solar cell apparatus.

A further object is to improve light reflection within the solar cell apparatus and thus increasing the short circuit current density (Jsc) and the efficiency of the system.

A further object of the invention is to realize an optimal thickness of the n-type layer of the n-doped µc-Si:H structures in order to achieve an appropriate balance between transparency and conductivity of the solar cell apparatus.

Still, another object is to provide a method for forming a solar cell apparatus which is suitable for large area photovoltaic modules applications.

These and other aims are achieved by the present invention by a solar cell apparatus and by a method for forming a solar cell apparatus as described and claimed herein.

According to a preferred embodiment, the invention allows is the production of a tandem solar cell apparatus comprising an amorphous a-p-i-n-Si:H structure and a microcrystalline µc-p-i-n-Si:H structure comprising a n-doped µc-Si:H with improved total efficiency.

Preferred features are defined in the dependent claims.

BRIEF DESCRIPTION OF THE DRAWINGS

These and other features and advantages of the invention will be better apparent from the following description of some exemplary and non-limitative embodiments, to be read with reference to the attached drawings, wherein.

DETAILED DESCRIPTION OF THE INVENTION

With reference initially to FIG. 1, a solar cell apparatus according to the present invention is globally represented with the reference number 100.

According to a preferred embodiment, the solar cell apparatus 100 comprises a substrate 101 preferably produced with glass, ceramic, metallic, polymeric materials or the like.

Preferably, the substrate 101 identifies a first end 10 of the solar cell apparatus 100 atop which further layers are realized.

As will be better described in the following, preferably the substrate 101 is treated via Chemical Vapour deposition (CVD) methods. According to an embodiment, the solar cell apparatus 100 comprises a n-type transparent conductive oxide (TCO) layer 102.

Preferably, the solar cell apparatus 100 comprises a p-i-n structure 120.

According to an embodiment, the p-i-n structure 120 comprises a p-type layer 103, an i-type layer 104 and a n-type layer 105.

Preferably, a metal back layer 106 is comprised in the solar cell apparatus 100, realized on the n-type layer 105 and defining a second end 20 of the solar cell apparatus 100 that is opposite to the first end 10.

According to an embodiment, the n-type transparent conductive oxide (TCO) layer 102 and the p-i-n structure 120 are sequentially deposited atop the substrate 101.

According to an embodiment, the n-type layer 105 comprises n-type donors 115.

According to an embodiment, the n-type donors form an n-type donor system that is a network of donors atoms or a cluster of donors atoms or a layer of donors atoms.

Descriptions of possible embodiments of a donor system are reported in the scientific book titled "Physics and Applications of CVD Diamond" by Satoshi Koizumi, Christoph Nebel, Milos Nesladek.

Preferably, the n-type donors 115 include phosphorus atoms.

According to an embodiment, the n-type donors atomic composition of the n-type layer 105. 115 comprise oxygen atoms at an atomic concentration comprised between 5% and 25% of the overall Thanks to this technical solution, threefold coordinated oxygen atoms are introduced in the n-type layer 105. It is strictly to be avoided any presence or diffusion of the threefold coordinated oxygen atoms into the i-type layer 104 because it would reduce the solar cell apparatus efficiency.

As improving technical effect, a controlled oxygen incorporation in the n-type donors 115, and thus in the n-type layer 105, together with the presence of phosphorus atoms, reduces the amorphization and the mean defects density induced by the phosphorus atoms presence in the n-type layer 105 thus increasing the effective n-doping.

Preferably, the n-type layer 105 has a microcrystalline or nanocrystalline phase structure.

According to an embodiment, the p-i-n structure 120, comprised in the solar cell apparatus 100, has a microcrystalline or nanocrystalline phase structure (labeled in the followings respectively as $\mu c$-Si, nc-Si).

Furthermore, the p-type layer 103 and/or the i-type layer 104 can have an amorphous or mixed phase (amorphous-microcrystalline phase) structure (labeled in the followings respectively as, a-Si and m-Si).

Moreover, the formation of silicon-oxygen bonds Si—O in the microcrystalline or nanocrystalline structure ($\mu c$-Si and nc-Si) leads to an increase of the overall band-gap of the n-type layer 105, thus increasing the barrier to the photo-generated holes that are consequently reflected back at the interface between the i-type layer 104 and the n-type layer 105 improving in this way the carrier collection at the side with the junction to the p-type layer 103.

Preferably, the p-i-n structure 120 and, particularly, the n-type layer 105 comprise hydrogen atoms.

In an embodiment, hydrogen concentration ranges between 7-25% and silicon concentration ranges between 49-67% of the overall atomic composition of the n-type layer 105.

Preferably, the p-i-n structure 120, comprised in the solar cell apparatus 100, has a microcrystalline or nanocrystalline silicon hydrogenated structure (labeled as $\mu c$-Si:H and nc-Si:H).

It is assumed that an amorphous continuous random network with only short range order of a silicon hydrogenated (a-Si:H) p-i-n structure can incorporate impurity atoms, such as phosphorus P and boron B, with coordination that corresponds to the bonding configuration with the lowest energy. This property of the continuous random network is different from the crystalline structure's one, in which, due to the long range order, the impurity atoms are forced to adopt the fourfold coordination of the host atoms (in this case silicon Si).

The doping efficiency in amorphous silicon hydrogenated a-Si:H structure, which is defined as the fraction of dopant atoms with fourfold coordination with respect to the overall of the atoms in the structure, is rather low: it is in the range of $10^{-2}$-$10^{-3}$ in a-Si:H (while in single crystal silicon the doping efficiency at room temperature is almost unity).

Hence, relatively high concentrations of phosphorous atoms must be introduced into amorphous silicon hydrogenated structures in order to obtain enough atoms having an effective fourfold coordination material showing high conductivity.

In case of n-doping in a-Si:H, the formation of defect-compensated donors in the case of phosphorus atoms is the major doping mechanism and it is known as the autocompensation model. The most important result of this model is that doping of a-Si:H unavoidably leads to creation of dangling bonds. Doped a-Si:H structures have defect densities two or three orders of magnitude larger than that of the intrinsic undoped a-Si:H structures.

Though $\mu c$-Si:H and nc-Si:H have better conductive characteristics than the a-Si:H material, it is remarkably less performing than crystalline silicon (c-Si) and polycrystalline Silicon (polyc-Si). This is because the $\mu c$-Si:H and nc-Si:H are a mixed amorphous-crystalline (commonly called "heterophase") material consisting of silicon crystallites embedded in a-Si:H structures. Due to the presence of a-Si:H in the matrix, the doping efficiency in $\mu c$-Si:H and nc-Si:H cannot be controlled as well as in c-Si or in poly-Si. This implies that for $\mu c$-Si:H and nc-Si:H it is not possible to dope the n-type layer in an efficient way and to increase the phosphorus concentration without inducing further amorphization of the crystalline architecture as well as increasing defects density that enhances the trapping of charge carriers thus reducing the solar cell efficiency.

Preferably, the n-type donors 115 comprise phosphorus atoms at an atomic concentration comprised between 1% and 4% of the overall atomic composition of the n-type layer 105.

This technical solution grants the technical benefit of producing effective n-type donors 115 comprised in the n-type layer 105 without achieving a counter-effective amorphization induced by excessive phosphorus atoms concentration.

According to an embodiment, the n-type donors 115 comprise oxygen atoms at an atomic concentration comprised between 7% and 12% of the overall atomic composition of the n-type layer 105.

This configuration lends the technical benefit of achieving an efficient balance between transparency to radiation and conductivity of the structures comprised in the p-i-n structure 120 and thus in the solar cell apparatus 100: in fact, the so produced n-type donors 115 enhance the cell conversion efficiency by mainly acting on improved light management and collection of photo-generated holes.

Furthermore, the refractive index of the n-doped $\mu c$-Si:H and nc-Si:H layer are decreased below the conventional value of the n-type layer $\mu c$-Si:H which typically is around 3.5, reaching values between 2 and 3. As a consequence, the light management at the metal back layer 106 of the solar cell, that works as an electrode, is optimized because more photons are reflected back in the intrinsic $\mu c$-Si:H or i-nc-Si:H radiation absorbing layers.

Figure 3:
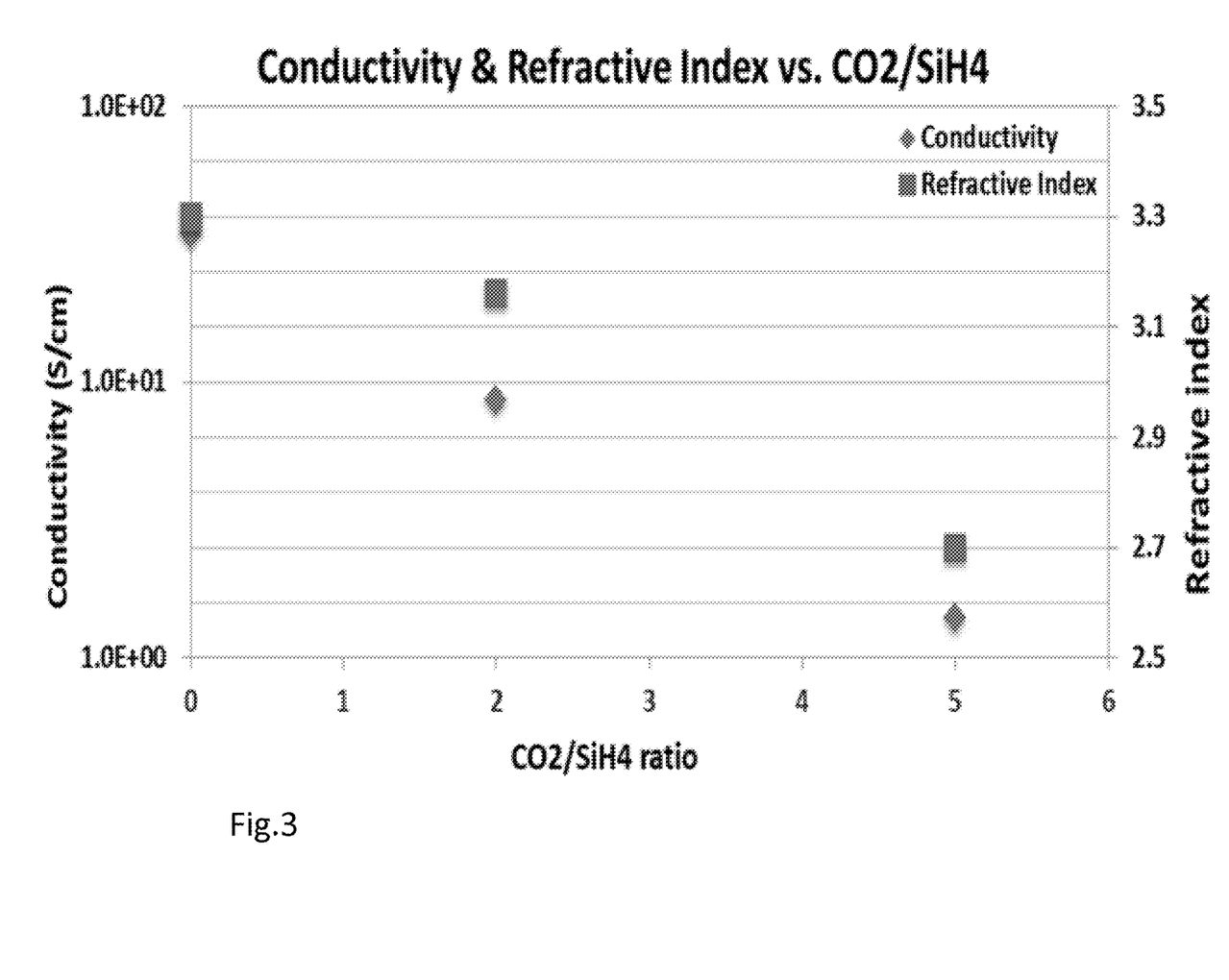
FIG. 3 is a diagrams plotting the Refractive Index and Conductivity as a function of the $CO_2/SiH_4$ ratio of a µc-Si:H p-i-n structure comprising a O-doped µc-Si:H n-type layer.

FIG. 3 plots the comparison between refractive index and conductivity as a functions of the $CO_2/SiH_4$ ratio showing that a balanced trade-off is achieved between conductivity and a refractive index which is much smaller than 3.5: as previously described, this condition allows to enhance the reflection of the light at the metal back layer 106 of the solar cell.

Thanks to these technical solutions, it is possible to achieve refractive indices lower than the value 3 (especially at 800 nm, that is the value around the maximum response for the microcrystalline $\mu c$-Si:H solar cell apparatus 100), together with conductivities higher than 1 S/cm.

Furthermore, these technical effects have been evaluated thanks to compositional and structural analysis described in details in the following.

Figure 4:
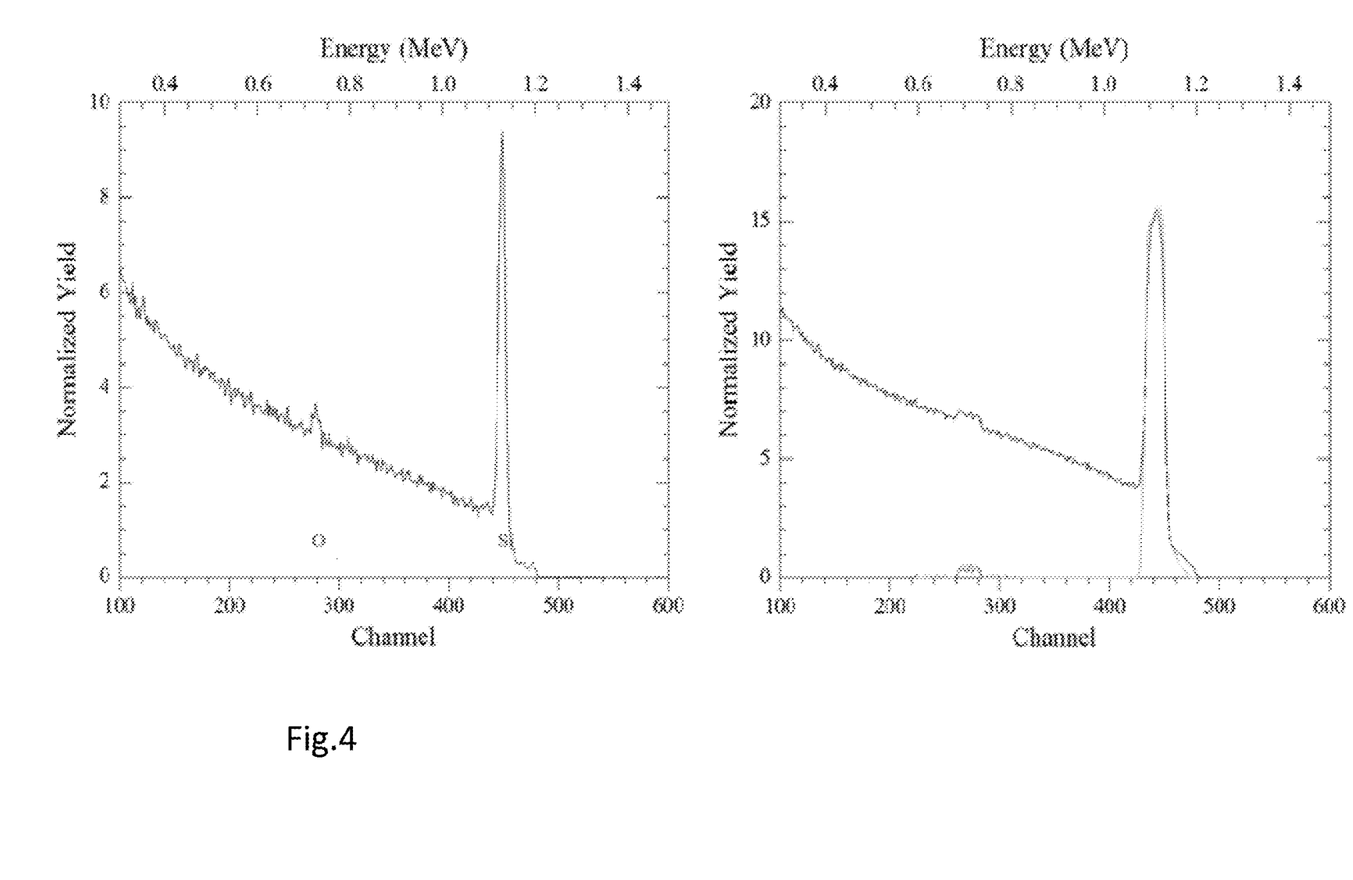
FIG. 4 shows Rutherford backscattering (RBS) analysis of a 0-doped µc-Si:H n-type layer used in a µc-Si:H solar cell in accordance with some embodiments of the present invention.

The effective oxygen content achieved in the produced n-type layer 105 accordingly to the proposed invention has been evaluated by Rutherford Backscattering Spectroscopy (RBS). The RBS was performed by using He ion beam at 2 MeV, theta 0, phi 15, cony 2.37 keV/ch+65 keV, omega 0.93 mstr and channeling axis <100>. As an example, see FIG. 4 shows a RBS plot for a n-oxygen doped-μc-Si:H: it can be derived, from the signal under channeling conditions, that the oxygen area concentration (RBS dose) is about $1.2*10^{16}$ $cm^{-2}$. As reference a typical oxygen area concentration (RBS dose) of a $SiO_2$ layer of same thickness has an area oxygen concentration of $1.3*10^{17}$ $cm^{-2}$. In FIG. 4 an n-doped-μc-Si:H enriched in oxygen as according to the present invention RBS plot is shown.

Therefore, the atomic composition of the n-type layer 105 μc-Si:H (comprising the n-type donors 115 with doping oxygen atoms) has been calculated, taking into account also the hydrogen atomic content, and it corresponds to: Si 67% O 7%, H 25%, P1%. Moreover, as shown in FIG. 5, in order to evaluate and compare both oxygen and hydrogen contents in the n-type layer 105 μc-Si:H comprising the n-type donors 115 with doping oxygen atoms, it has been used Time of Flight—Secondary Ion Mass Spectrometry (ToF-SIMS) analysis.

Figure 5:
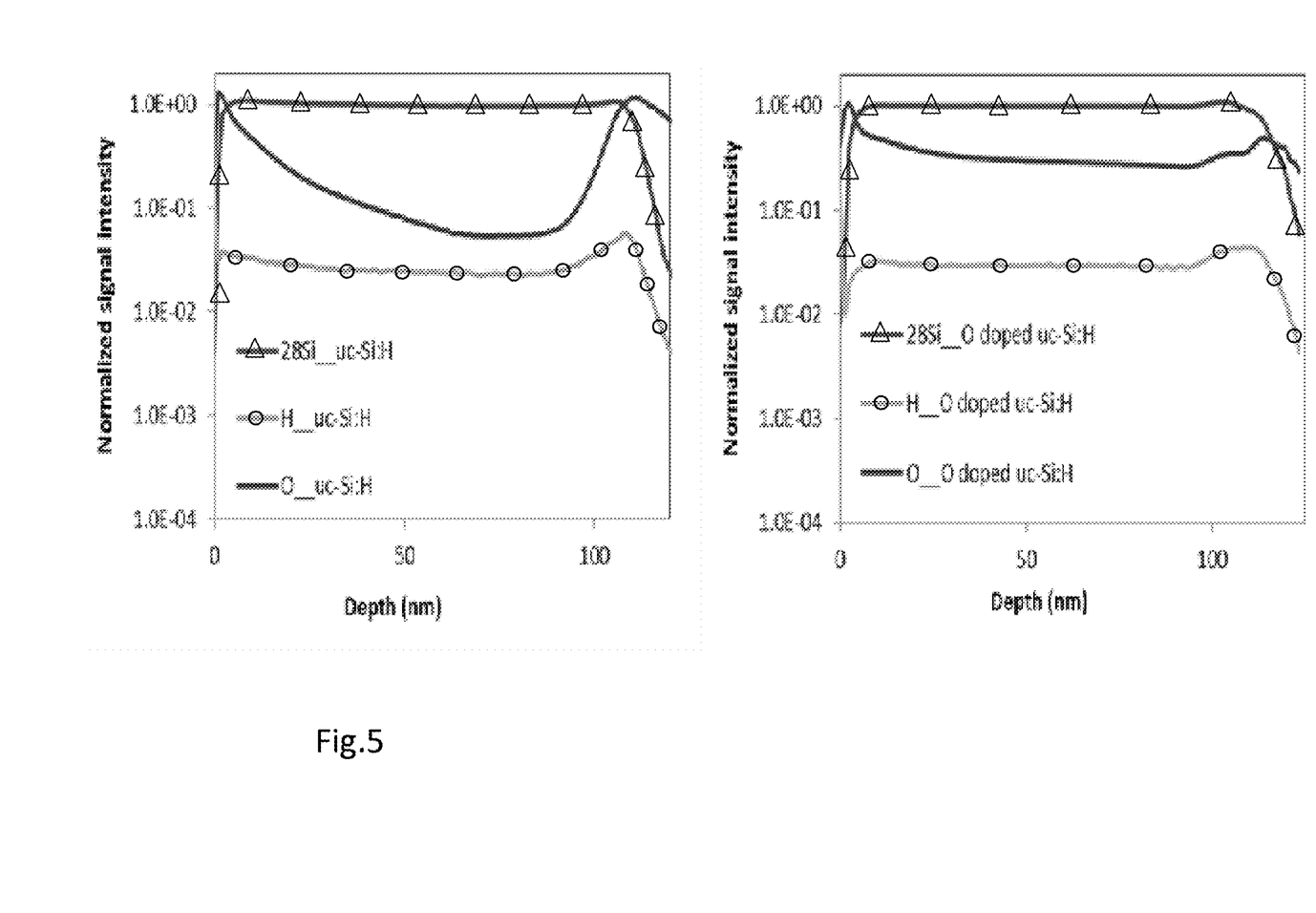
FIG. 5 compares two Secondary Ion Mass Spectrometry (SIMS) analyses respectively of a non-doped µc-Si:H and a O-doped n-type layer used in a pc-Si:H solar cell in accordance with some embodiments of the present invention.

Furthermore, for a clearer evaluation, FIG. 5 shows the comparison between oxygen and hydrogen contents in n-type layer 105 μc-Si:H conventional microcrystalline hydrogenated silicon doped with phosphorus (plot on the left), and in n-type layer 105 μc-Si:H oxygen rich n-type microcrystalline silicon layer.

In this case, both samples have a thickness of about 100 nm. It is apparent that the oxygen signal shows a peak at the surface of the layers related to surface oxidation (native oxide) formation. In case of the conventional microcrystalline silicon n-type layer the atomic O signal decreases from the surface to the bulk where it reaches a stable value. In the case of the oxygen rich microcrystalline silicon n-type layer the bulk signal is more than 5 times higher than the conventional μc-Si:H layer. The signal of oxygen O decreases in the conventional microcrystalline silicon layer is an artifact of the ToF-SIMS technique, due to the fact that the sputtering beam used for the depth profile induces a collisional knock-on effect on the oxygen atoms present in the surface oxidized layer (native oxide). RBS analyses do not show significant presence of oxygen in the conventional microcrystalline silicon layer.

The hydrogen concentration is quite the same, within the resolution of the analytical technique, both in the conventional n-type μc-Si:H and in the oxygen rich n-type microcrystalline silicon.

Preferably, the n-type layer 105 has a thickness comprised between 20 and 60 nm. This thickness range has been investigated and has proved itself to be an efficient and functional dimensional solution for achieving and enhancing the previously described balance between transparency to radiation and conductivity of the structure obtained as a function of the oxygen atoms concentration together with the phosphorus atoms in the n-type layer 105 and the μc-Si:H or nc-Si:H structure of the p-i-n structure 120.

According to an embodiment, the n-type layer 105 has a thickness of 40 nm.

This value of thickness has proved itself to be an optimal solution for the transparency, conductivity, stability and deposition process conditions.

According to an embodiment, the solar cell apparatus 100 comprises an amorphous p-i-n structure 201 (a-p-i-n) arranged on or under said p-i-n structure 120.

Figure 2:
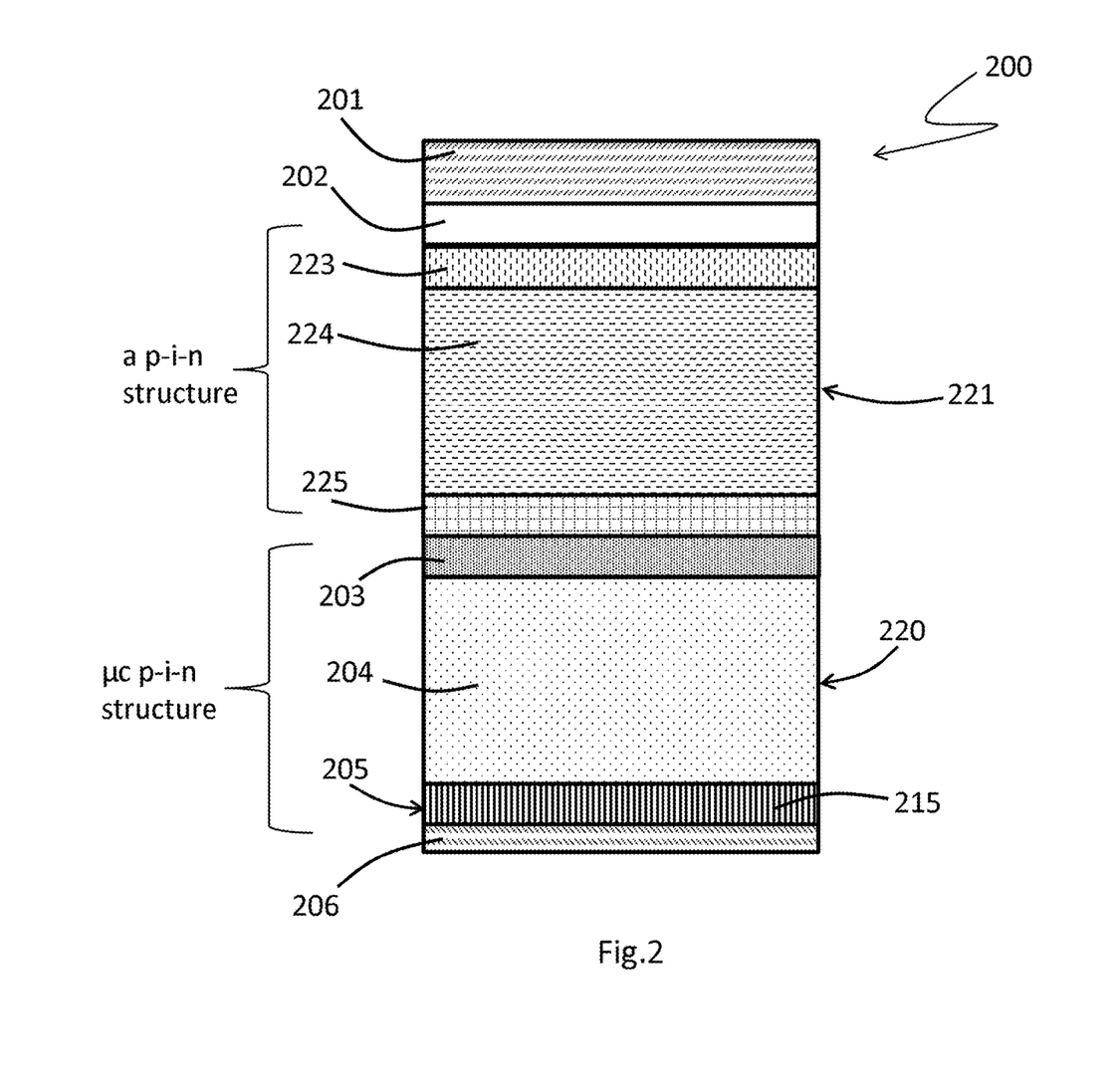
FIG. 2 is an illustrative and partial cross-sectional view of an alternative embodiment in a tandem configuration of the solar cell apparatus of the present invention.

This type of configuration of the solar cell apparatus 100 is hereby called tandem solar cell apparatus 200 and an example, not exhaustive of all the possible embodiments, is represented in FIG. 2.

Preferably, the tandem solar cell apparatus 200, comprises a tandem substrate 201 produced with ceramic, metallic, polymeric materials or the like.

Preferably, the tandem substrate 201 identifies a first end of the tandem solar cell apparatus 200 atop which further layers are realized.

According to an embodiment, the tandem solar cell apparatus 200 comprises a tandem n-type transparent conductive oxide (TCO) layer 202.

Preferably, the tandem solar cell apparatus 200 comprises a tandem amorphous p-i-n structure 221 arranged in electric contact with the tandem n-type transparent conductive oxide (TCO) layer 202 and including an amorphous p-type layer 223, an amorphous i-type layer 224, an amorphous n-type layer 225 (see FIG. 2).

All these layers are realized having an interface granting an electric contact between surfaces of contact.

Preferably, the amorphous p-type layer 223 is in electric contact with the amorphous i-type layer 224, and the amorphous i-type layer 224 is in electric contact with the amorphous n-type layer 225.

According to an embodiment, the tandem amorphous p-i-n structure 221 is in electric contact with at least one surface of a tandem microcrystalline (or nanocrystalline) p-i-n structure 220.

Preferably, the tandem microcrystalline (or nanocrystalline) p-i-n structure 220 comprises a microcrystalline p-type layer 203, a microcrystalline i-type layer 204, and a microcrystalline n-type layer 205.

For a more compact and concise description, the features presented in the followings regarding microcrystalline structures also apply, unless not specifically denied, equivalently to nano-crystalline structures.

With reference to the embodiment described in FIG. 2, a metal back layer 206 is comprised in the tandem solar cell apparatus 200, realized on the microcrystalline n-type layer 105 and defining a second end of the tandem solar cell apparatus 200 that is opposite to the first end previously described.

According to an embodiment, the tandem n-type transparent conductive oxide (TCO) layer 202, the tandem amorphous p-i-n structure 221 and the tandem microcrystalline (or nanocrystalline) p-i-n structure 220 are sequentially deposited atop the tandem substrate 201.

According to an embodiment, the microcrystalline n-type layer 205 comprises microcrystalline n-type donors 215.

Preferably, the tandem solar cell apparatus 200 comprises hydrogen atoms.

The compositional and dimensional features of the microcrystalline n-type donors 215 comprised in the microcrystalline n-type layer 205 of the tandem microcrystalline (or nanocrystalline) p-i-n structure 220 of the tandem solar cell apparatus 200 are the same of the n-type donors 115 of the n-type layer 105 of the p-i-n structure 120 of the solar cell apparatus 100.

It is significant to report that the technical solution hereby described, yields a significantly higher performance: as a matter of facts, the tandem solar cell apparatus 200 as previously described increases its efficiency of one percentage point, with respect to a tandem solar cell produced according to the teachings of the state of the art. It has been recorded that the efficiency increases from 13.6% to 14.7%. This increase is related to the improvement of Jsc in the tandem microcrystalline p-i-n structure 220 of the tandem solar cell apparatus 200, due to the lower refractive index of the microcrystalline n-type layer 205 and to the improvement of the fill factor due to increased holes reflection at the i/n interface of the tandem microcrystalline p-i-n structure 220.

The solar cell parameters of the tandem solar cell apparatus 200 compared to those of a conventional tandem solar cell apparatus are shown in Table 1. The resulting effect is an increase of output power of the tandem solar cell 200 about 10%.

TABLE 1

| Cell Parameters | Reference Cell | O rich n-type µc-Si:H |
|---|---|---|
| Jse (mA/cm$^2$) | 13.8 | 14.15 |
| Voc (V) | 1.33 | 1.32 |
| FF (%) | 73.8 | 78.5 |
| Effciency (%) | 13.6 | 14.7 |

Figure 9:
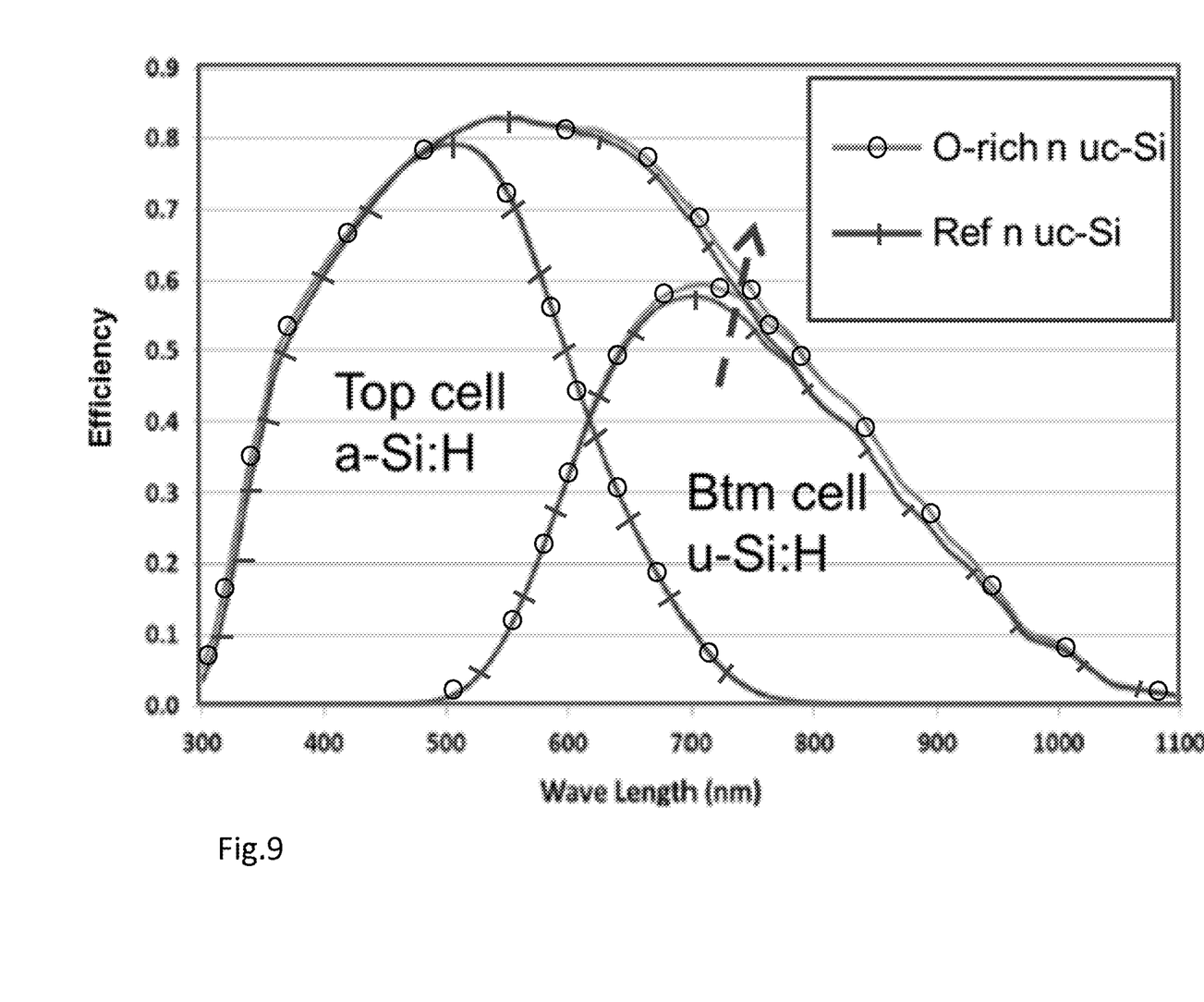
FIG. 9 is a graph plotting Efficiency versus Wavelength for a non-doped pc-Si:H and a O-doped n-type layer

FIG. 9 shows the comparison of the spectral responses or quantum efficiencies of the tandem amorphous p-i-n structure 221 (labeled as "top" in the figure) and the tandem microcrystalline p-i-n structure 220 (labeled as "bottom" in the figure), produced according to the teachings of the state of the art or to the teaching of the present invention, where the efficiency increment is clearly related to the increase of microcrystalline cell output due to the O-rich microcrystalline n-type layer 205.

As can be seen from peaks deconvolutions plotted in FIG. 9 as Efficiency [%] versus Wave Length [nm], the tandem solar cell apparatus 200 produced according to the present invention (identified by the line with the circle) has higher performances than a tandem solar cell produced accordingly to the teaching of the state of art (identified by the crossed line). This efficiency improvement is particularly clear in the range between 600 nm and 1000 nm in which the microcrystalline p-i-n structure 220 mainly operates.

Figure 10:
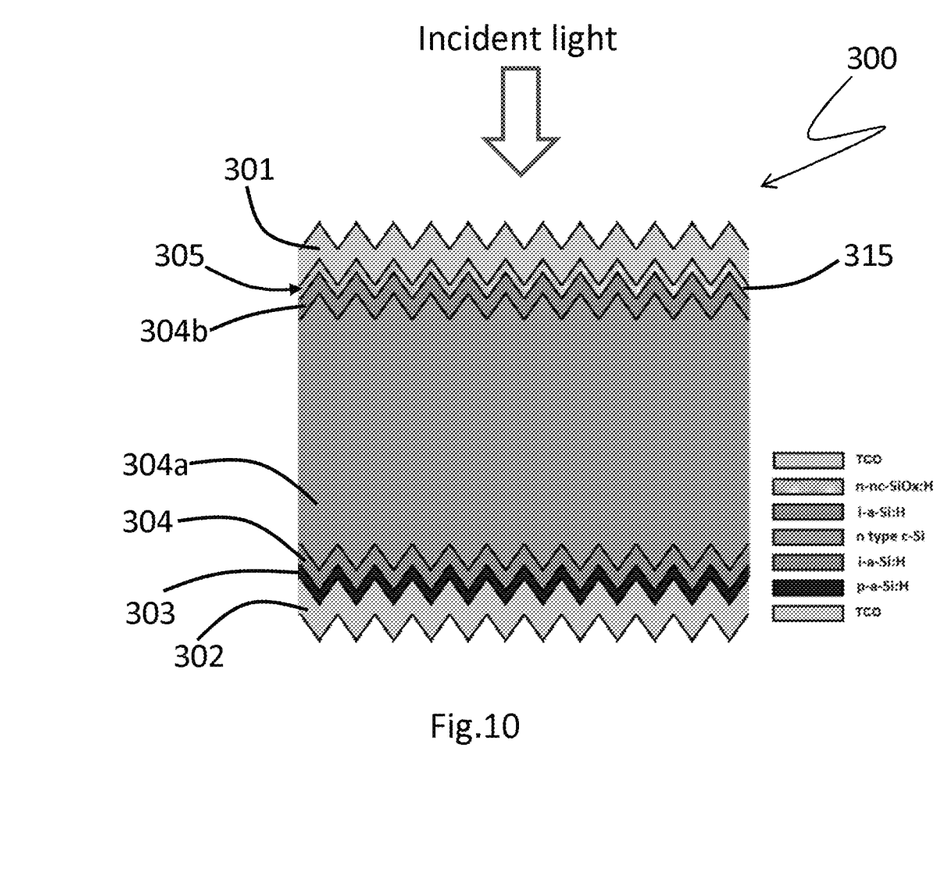
FIG. 10 is an illustrative and partial cross-sectional view of an alternative embodiment in a heterojunction solar cell configuration of the solar cell apparatus of the present invention.

According to an embodiment of the present invention, a heterojunction silicon solar cell apparatus 300 is produced. The heterojunction silicon solar cell apparatus 300 comprises a heterojunction p-i-n structure comprising a heterojunction p-type layer 303, a heterojunction i-type layer 304, a heterojunction n-type layer 305, the heterojunction n-type layer 305 comprising heterojunction n-type donors 315 including phosphorus atoms.

Preferably, the heterojunction n-type donors 315 comprise oxygen atoms at an atomic concentration comprised between 5% and 25% of the overall atomic composition of the heterojunction n-type layer 305.

It is relevant to note that the Silicon Heterojunction Solar cells architecture (SHJ) solar cells with thin intrinsic buffer layers provide numerous advantages as compared to conventional c-Si technology, e.g., simple and low temperature process, good surface passivation, processability of very thin wafers, and a high energy conversion efficiency with a low temperature coefficient. These solar cells consist of thin amorphous silicon layers on monocrystalline silicon wafers. The key point of these structures is the displacement of highly recombination-active (ohmic) contacts from the crystalline surface by insertion of a film with wide bandgap. To reach the full device potential, the hetero-interface state density should be minimal.

Preferably, hydrogenated amorphous silicon (a-Si:H) films of only a few nanometer thin are appealing candidates for this: their bandgap is wider than that of c-Si and, when intrinsic, such films can reduce the c-Si surface state density by hydrogenation. In addition, these films can be doped relatively easily, either n- or p-type, allowing for the (lithography-free) fabrication of contacts with record-low values for the saturation-current density. Impressive large-area (>100 cm$^2$) energy-conversion efficiencies (~23%) have been reported by Sanyo, Japan for such devices.

The CVD or PECVD deposited doped layers will ensure on one side the junction formation (p-type a-Si:H on n-type wafer) and the surface field (n-type a-Si:H on n-type wafer) on the other side. In the case reported on FIG. 1, the configuration chosen for the experiment, is called back emitter configuration as the p-type PECVD layer (on n-type wafer) is deposited at the back (with respect to the incident light) of the solar cell and will be the charge collecting electrode, while the n-a:Si layer is deposited at the front to ensure good surface field and reduce electrical recombination. On top of the silicon layers, an anti-reflective transparent conductive oxide (TCO) film with a low sheet resistance is deposited by physical vapor deposition (PVD). Current collection is made possible by a screen-printed metallic grids.

According to an embodiment of the invention reported in FIG. 10, the heterojunction silicon solar cell apparatus 300 comprises a front transparent conductive oxide (TCO) 301, a back transparent conductive oxide (TCO) 302, the heterojunction p-type layer 303, the heterojunction i-type layer 304, a heterojunction n-type crystalline layer 304a, a heterojunction i-type amorphous layer 304b, the heterojunction n-type layer 305 comprising heterojunction n-type donors 315.

Preferably, the light is incident on the front transparent conductive oxide (TCO) 301 and it encounters sequentially the heterojunction n-type layer 305 comprising heterojunction n-type donors 315, then the heterojunction i-type amorphous layer 304b, the heterojunction n-type crystalline layer 304a, the heterojunction i-type layer 304, the heterojunction p-type layer 303, and the back transparent conductive oxide (TCO) 302. This type of configuration is a "back emitter configuration".

According to a preferred embodiment of the invention, the heterojunction p-type layer 303, heterojunction i-type layer 304, heterojunction i-type amorphous layer 304b and the heterojunction n-type layer 305 comprise hydrogen atoms.

Preferably, the solar cell apparatus 100 comprises the heterojunction n-type crystalline layer 304a and the heterojunction i-type amorphous layer 304b between the i-type layer 104 or the heterojunction i-type layer 304 and the n-type layer 105 or the heterojunction n-type layer 305 comprising heterojunction n-type donors 315, producing the heterojunction solar cell apparatus 300.

The efficiency of SHJ devices is typically dominated by a pronounced trade-off between the optical and electrical losses at the front side. Doped a-Si layers can achieve reasonable conductivity properties by incorporating dopant during the PECVD reaction but the presence of dopants will increase the material defectiveness making the materials less transparent to the light. In the front side this material must be very thin to allow more light to reach the c-Si wafer absorber.

In the case of back emitter configuration the front side doped layer is n-type, the possibility of replacing a conventional n-type a-Si:H with n-type hydrogenated nano-crystalline SiOx layer (see FIG. 2) is appealing as the latter is much more transparent with respect to conventional a-Si, up to 30% more light (see FIG. 3) could be transmitted in the wavelength ranges where the c-si cell is absorbing, by slight oxidation of the n-doped layer adding CO2 in the process mixture at the right concentration and process regime without jeopardizing too much the electrical properties.

Figure 6:
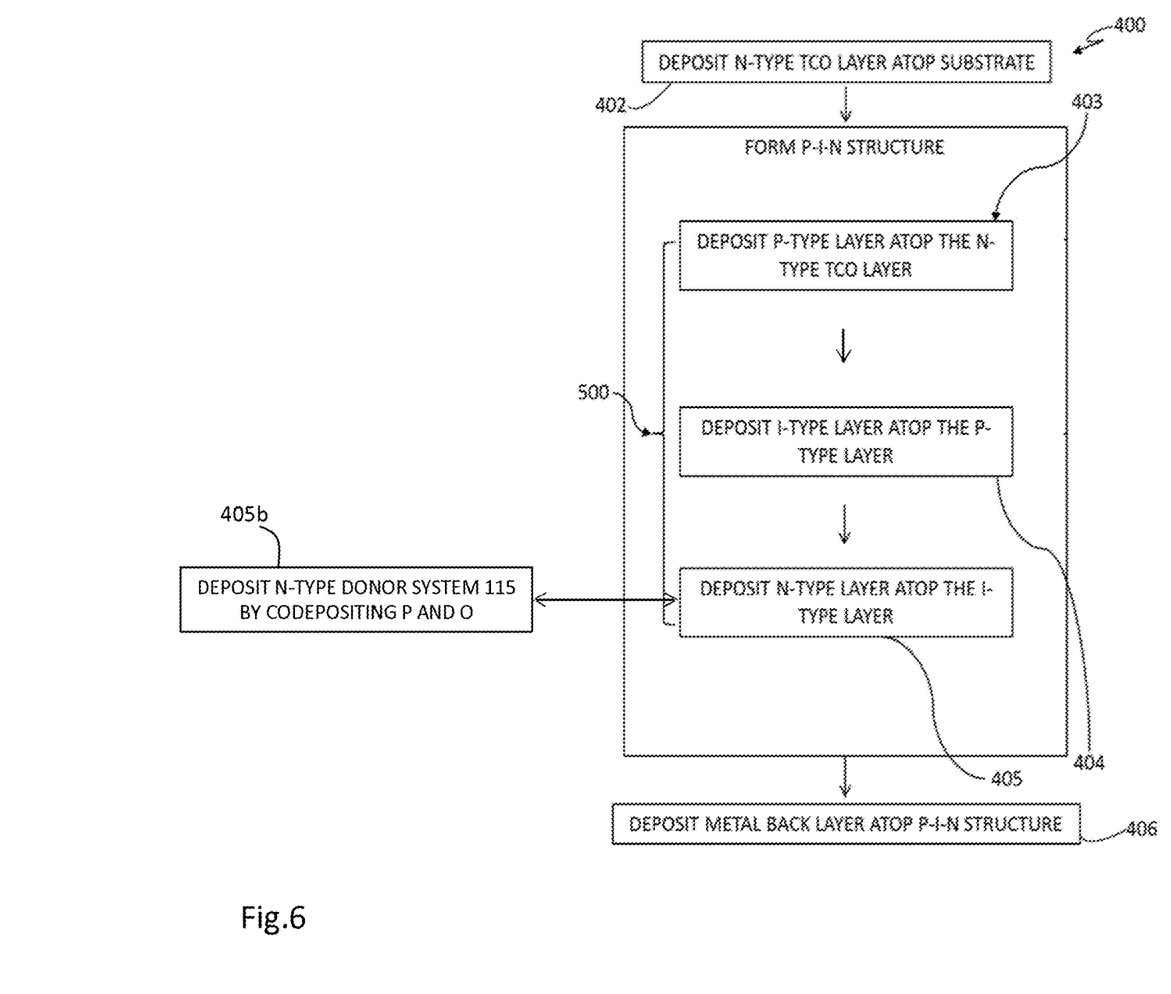
FIG. 6 is a flow diagram of a method of formation of a solar cell apparatus via Chemical Vapour Deposition (CVD) in accordance with some embodiments of the present invention.
Figure 7:
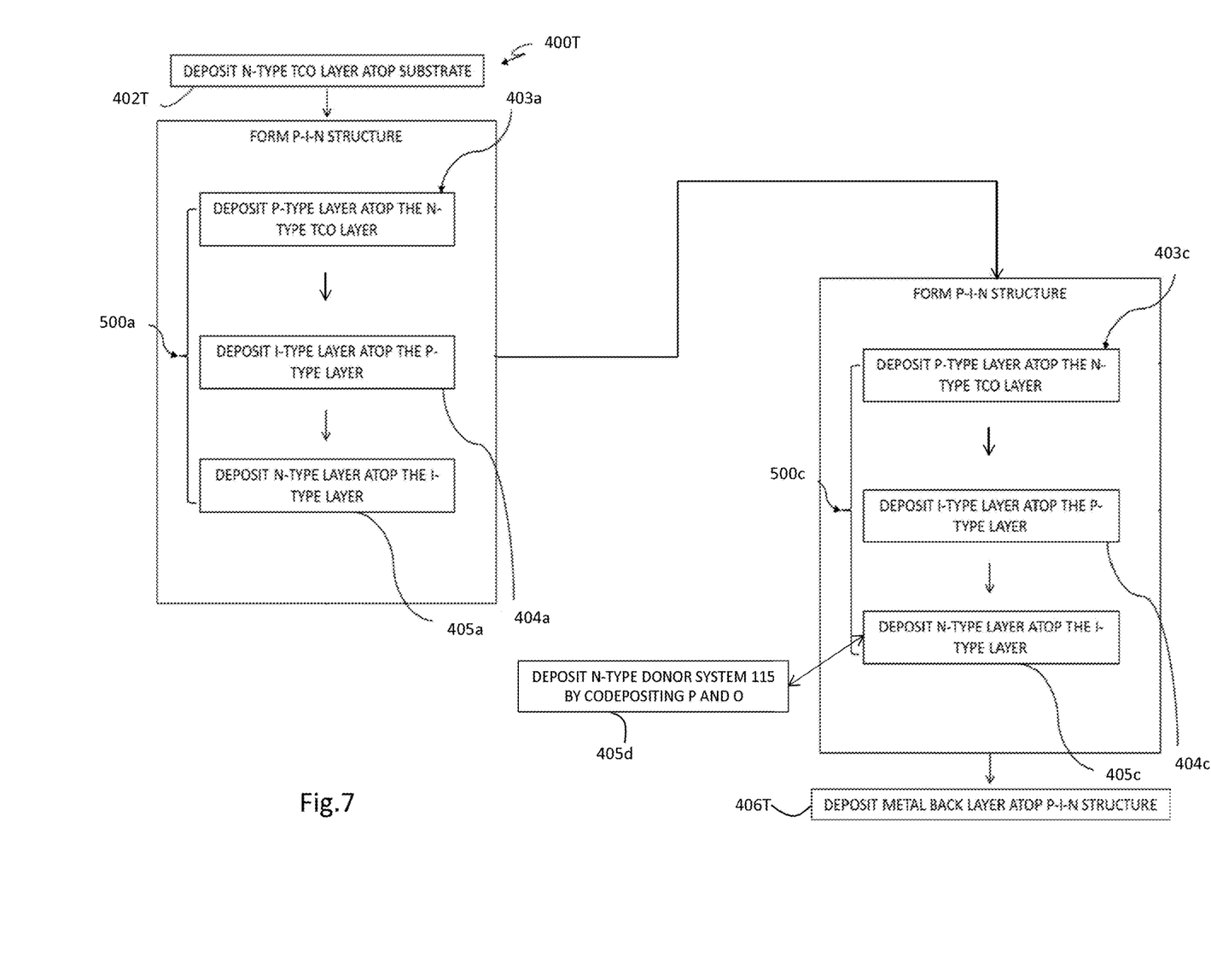
FIG. 7 is a flow diagram of the method of formation of a tandem solar cell apparatus via Chemical Vapour Deposition (CVD) in accordance with some embodiments of the present invention.

As schematically represented in FIG. 6 and FIG. 7, the solar cell apparatus 100 and the tandem solar cell apparatus 200 are preferably deposited via Chemical Vapour Deposition (CVD) according to a first and a second embodiment of the method noted respectively with the reference number 400 in case of solar cell apparatus 100 production and with the reference number 400T in case of tandem solar cell apparatus 200 production.

The first embodiment 400 of the method for forming the solar cell apparatus 100 or the second embodiment 400T of the method for forming the tandem solar cell apparatus 200 comprises:
- depositing the n-type transparent conductive oxide (TCO) 102 (or 202 in case of tandem cell apparatus 200 production) on a substrate 101 (or 201 in case of tandem cell apparatus 200 production) via CVD,
- forming a p-i-n structure 120 (or 220 in case of tandem cell apparatus 200 production) including:
- depositing a p-type layer 103 (or 203 in case of tandem cell apparatus 200 production) atop said n-type transparent conductive oxide (TCO) 102 (or 202 in case of tandem cell apparatus 200 production) via CVD;
- depositing an i-type layer 104 (or 204 in case of tandem cell apparatus 200 production) atop said p-type layer 103 (or 203 in case of tandem cell apparatus 200 production) via CVD;
- depositing a n-type layer 105 (or 205 in case of tandem cell apparatus 200 production) atop said i-type layer 104 (or 204 in case of tandem cell apparatus 200 production) via CVD;

wherein depositing said n-type layer 105 (or 205 in case of tandem cell apparatus 200 production) comprised in said p-i-n structure 120 (or 220 in case of tandem cell apparatus 200 production) includes depositing n-type donors 115 (or 215 in case of tandem cell apparatus 200 production) including phosphorus and oxygen atoms via CVD.

Preferably, the p-i-n structure 120 (or 220 in case of tandem cell apparatus 200 production) are microcrystalline or nanocrystalline structures.

Preferably, the first embodiment 400 (or the second embodiment 400T) is performed on the substrate 101 (or substrate 201 in case of tandem cell apparatus 200 production) over which further layers or regions of materials are to be deposited.

Preferably, the substrate 101 (or substrate 201 in case of tandem cell apparatus 200 production) is made of any suitable material to support and enhance a p-i-n junction thus to positively collaborate in generating the solar cell apparatus 100 (or the tandem solar cell apparatus 200). As an example, in some embodiments, the substrate 101 (or substrate 201 in case of tandem cell apparatus 200 production) is a glass substrate, a polymer substrate, a metal substrate, a composite material or the like.

In the followings, for purposes of a more compact and concise description, phases common to the first embodiment 400 and the second embodiment 400T of the method are reported in a compact notification being separated by the symbol "/". Taking FIG. 6 or 7 as reference, the embodiments 400/400T generally begins at 402/402T wherein the n-type Transparent Conductive Oxide (TCO) layer 102/202 is deposited on the substrate 101/201, preferably via CVD.

Preferably, the n-type transparent conductive oxide (TCO) layer 102/202 comprises any material suitable to provide electrical conductivity together with sufficient transparency for the equipment. As an example, in some embodiments, the n-type transparent conductive oxide (TCO) layer 102/202 comprises cadmium stannate ($Cd_2SnO_4$), tin oxide (SnO), tin dioxide ($SnO_2$), zinc oxide (ZnO), combination thereof such as indium-tin oxide (ITO) or the like.

The n-type transparent conductive oxide (TCO) layer 102/202 comprises, in some embodiments, further dopants such as boron (B), gallium (Ga), aluminum (Al), tin (Sn).

Figure 8:
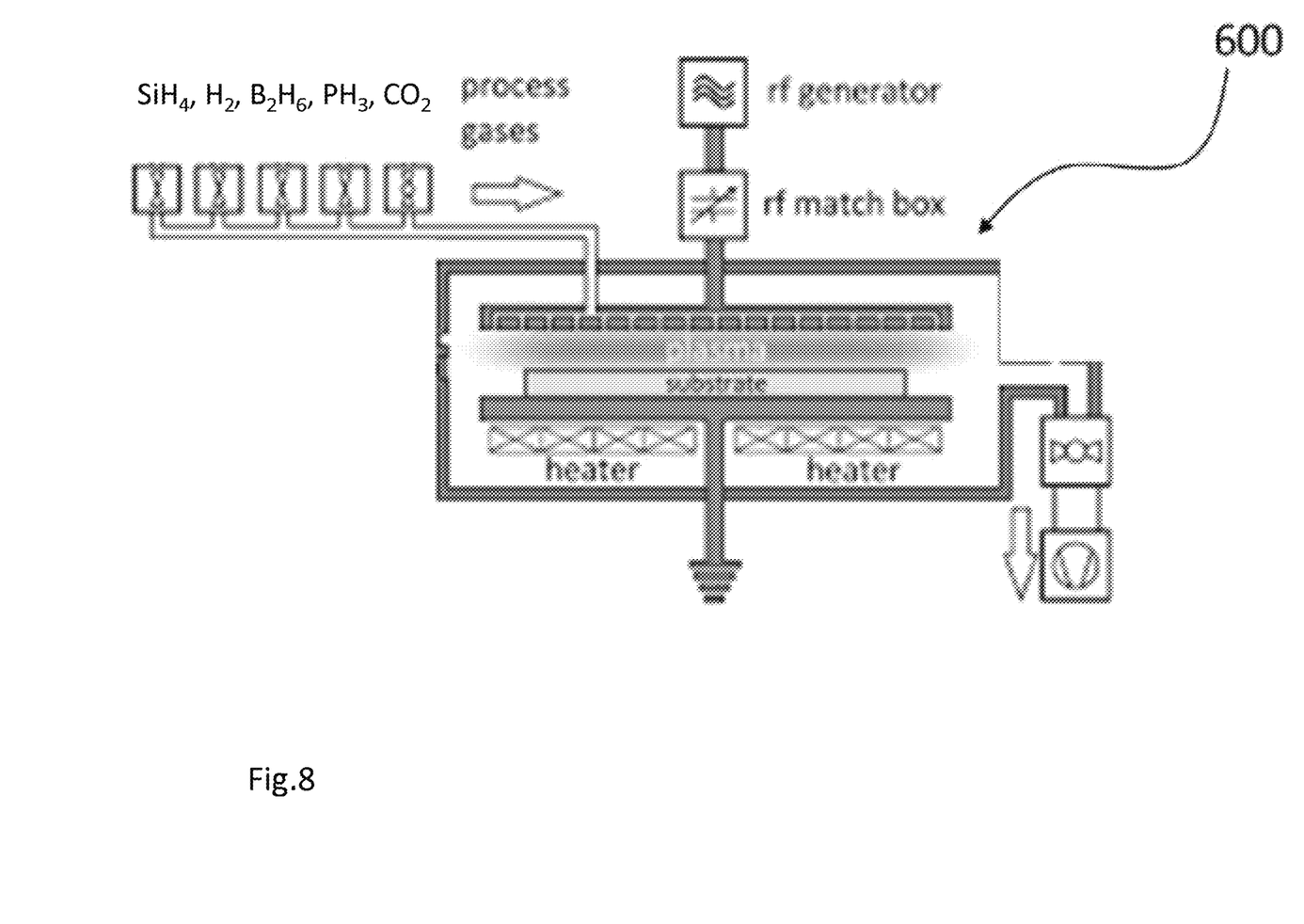
FIG. 8 is a schematic view of a Chemical Vapour Deposition (CVD) equipment.

With reference to FIG. 8, according to a preferred first embodiment 400 of the method, the CVD process is produced comprising a Plasma Activation step produced by a Plasma Enhanced Chemical Vapour deposition (PECVD) realized by a PECVD equipment 600.

Alternatively, other usable equipment for performing the CVD process hereby claimed are the Hot-Wire CVD or the Inductively-Coupled-Plasma CVD or the like. The CVD process offers the intrinsic benefit of having the possibility to produce at the phase 402/402T of the embodiments 400/400T of the method an as-grown textured n-type transparent conductive oxide (TCO) layer 102/202, improving light absorption by enhancing light trapping within it.

Preferably, by tuning the deposition conditions of the embodiments 400/400T achieved by using the PECVD equipment 600, and depositing ZnO as the n-type transparent conductive oxide (TCO) layer 102/202 it is possible to tune the optical haze properties (where haze is the ratio between diffused and total transmittance through the TCO).

At 403/403c of the embodiments 400/400T of the method for the solar cell apparatus 100/tandem solar cell apparatus 200 the microcrystalline or nanocrystalline p-type layer 103/203 is produced accordingly.

Preferably, to improve the photons absorption of the microcrystalline or nanocrystalline i-type layer 104, the microcrystalline or nanocrystalline p-type layer 103 is produced with SiC or SiOx or SixNy or combination thereof.

Preferably, the microcrystalline or nanocrystalline p-type layer 103 is produced setting the deposition parameters so as to produce microcrystalline or nanocrystalline or amorphous or mixed phases structures respectively.

The following deposition parameters reported are examples of possible conditions to be used during deposition process: $H_2$ 2 1-90 1; $SiH_4$ 5 sccm-1000 sccm; $PH_3$ 0.5 sccm-20 sccm; $CO_2$: 10 sccm-1000 sccm.

A preferred parameters set, especially for large area depositions, is: $H_2$: 90 1; $SiH_4$: 250 sccm; $PH_3$: 14 sccm; $CO_2$: 500 sccm.

In a further embodiment, the microcrystalline or nanocrystalline or amorphous p-type layer 103 is produced comprising hydrogen atoms H.

Moreover, the p-type layer 103 is preferably produced comprising alloys of silicon-oxygen Si—O or silicon-carbon Si—C.

According to an embodiment, dopants comprised in the microcrystalline or nanocrystalline p-type layer 103 are, for example, elements of the Group III such as boron (B), aluminum (Al), gallium (Ga) and combination thereof. Further preferably, precursors gas containing B are used due to their characteristic of being easier and safer to be used and handle than Al or Ga ones during plasma deposition processes. In order to positively deposit the microcrystalline or nanocrystalline p-type layer 103 the process parameters of the PECVD equipment 600 are advantageously finely controlled, monitored and tuned.

This phase is represented in FIG. 6 as 403 of the first embodiment 400 and as phase 403c of the second embodiment 400T. Particularly, a $H_2/SiH_4$ ratio low enough to minimize the incubation time due to $H_2$ induced ZnO surface modification is advantageously defined. In this manner, it is possible to avoid the formation of low density nucleation micro or nano crystallites and high enough to have fully coalesced micro or nano crystalline phase without the presence of amorphous phases within. Typical values of $SiH_4/(SiH_4+H_2)$ are 4-5% and $B_2H_6/(SiH_4+B_2H_6)$ around 4-8% for the p-type layer 103 amorphous phase structure and 0.5 and 0.4% respectively for the p-type layer 103 crystalline phase structure.

Preferably, the deposition rate used during 403/403c for depositing the microcrystalline or nanocrystalline or amorphous p-type layer 103 are sufficiently high to lessen $H_2$ induced accumulation layer which increases the depletion zone: this process feature is ruled by the $SiH_4$ flow set at 0.36 slm and the Plasma generator device power set at 0.1 W/cm$^2$. In some embodiments where the dopant is a boron compound advantageously are used precursor comprising trimethylboron ($B(CH_3)_3$ or TMB), diborane $(BH_3)_2$, borontrifluoride ($BF_3$), triethylboron ($B(C_2H_5)_3$ or TEB) or the like. To achieve an adequate doping of the microcrystalline or nanocrystalline or amorphous or mixed phase p-type layer 103/203, $B_2H_6$ or TMB flows must be controlled in the range of 0 to 100 sccm with the $SiH_4$ flow is constructively set at 0.3 slm and $H_2$ at 100 slm.

Next at phase 404/404c of the embodiments 400/400T of the method, the microcrystalline or nanocrystalline i-type layer 104/204 comprised in the microcrystalline or nanocrystalline p-i-n structure 120/220 (realized according to steps 500/500c) is deposited over the microcrystalline or nanocrystalline or amorphous or mixed phase p-type layer 103/203 as shown in FIGS. 1, 2, 6 and 7. Preferably, the microcrystalline or nanocrystalline i-type layer 104/204 exhibits a thickness comprised between 20 and 2000 nm. In some embodiments, the microcrystalline or nanocrystalline or amorphous or mixed phase i-type layer 104/204 comprises silicon Si, silicon carbide SiC, silicon oxides SiO, silicon and hydrogen Si—H or the like.

Preferably, the $SiH_4/(SiH_4+H_2)$ concentration is in the range of 0.3-2% for micro-crystalline and nano-crystalline and in the range of 2-10% for amorphous phase in order to ensure the proper crystalline structure.

Next at phase 405/405c of the embodiments 400/400T of the method, the microcrystalline or nanocrystalline n-type layer 105/205 comprised in the microcrystalline or nanocrystalline p-i-n structure 120/220 (realized at 500/500c) is deposited over the microcrystalline or nanocrystalline i-type layer 104/204 as shown in FIGS. 1 and 2. Preferably, the microcrystalline or nanocrystalline n-type layer 105/205 comprises an amorphous phase and, according to a preferred embodiment, exhibits a thickness comprised between 10 and 20 nm. In some embodiments the microcrystalline or nanocrystalline n-type layer 105 comprises silicon Si, silicon carbide SiC, silicon and hydrogen Si—H or the like. The $SiH_4/(SiH_4+H_2)$ ratio is 10% for the bulk deposition and is decreased to 0.7% at the interface with the micro-crystalline n-p junction.

Preferably, the microcrystalline or nanocrystalline n-type layer 105/205 comprises dopants suitable to enhance charge collection and thus increasing the efficiency of the solar cell apparatus 100. In particular suitable dopants are any element of Group V such as phosphorous P, arsenic As, antimony Sb or the like.

Preferably, the microcrystalline or nanocrystalline n-type layer 105/205 comprises n-type donors 115/215 including phosphorus and oxygen atoms.

Preferably, the n-type donors 115/215 comprise oxygen atoms having an atomic concentration comprised between 5% and 25% of the overall atomic composition of the n-type layer 105.

Preferably, the n-type donors 115/215 enhance the microcrystalline or nanocrystalline structure of the microcrystalline or nanocrystalline n-type layer 105/205.

Preferably, depositions of n-type donors 115/215 and microcrystalline or nanocrystalline n-type layer 105/205 are performed via CVD.

With reference to FIGS. 6 and 7, at phase 405b/405d of the embodiments 400/400T of the method the n-type donors 115/215 are produced by a co-deposition of phosphorus and oxygen during the production of the microcrystalline or nanocrystalline n-type layer 105/205.

Such co-deposition is achieved using $CO_2$, $SiH_4$ and $PH_3$ as process gases. Preferably, the optimal range of $CO_2/SiH_4$ atomic ratio has been identified as comprised between 0.2 and 2.5 inducing a process pressure in the deposition chambers ranging from 500 and 1800 Pa.

Preferably, the deposition process is conducted having the process chamber a temperature comprised between 140° C. and 200° C.

Preferably, the metal back layer 106 (or 206 in case of the tandem solar cell apparatus 200) is formed by any suitable deposition technic such as CVD or PVD or the like in accordance with the teachings described: for example in some embodiments the metal back layer 106/206 is formed by PECVD or, in some others, by magnetron sputtering.

After the deposition of the metal back layer 106/206, the embodiments 400/400T of the method generally terminate and then the solar cell apparatus 100 (or the tandem solar cell apparatus 200) is suitable to be further processed by any desired technic aimed at finishing or completing the solar cell apparatus 100 (or the tandem solar cell apparatus 200).

Preferably, the embodiment 400T of the method for producing the tandem solar cell apparatus 200 comprises:
depositing a further p-i-n structure 221 between the n-type transparent conductive oxide (TCO) 102 and the p-i-n structure 120/220 comprising the n-type layer 105 producing a tandem solar cell apparatus 200.

Preferably, the further p-i-n structure 221 is an amorphous p-i-n structure.

Preferably, the p-i-n structure 120 has a microcrystalline or nanocrystalline structure. Taking as reference FIG. 2, the amorphous p-i-n structure 221 comprises an amorphous p-type layer 223, an amorphous i-type layer 224 and amorphous n-type layer 225.

Preferably, a deposition sequence 500a for forming the amorphous p-i-n structure 221 has the following phases:
The amorphous p-type layer 223 is deposited on the tandem n-type transparent conductive oxide (TCO) layer 202 at phase 403a,
The amorphous i-type layer 224 is deposited on the amorphous p-type layer 223 at phase 404a,
The amorphous n-type layer 225 is deposited on the amorphous i-type layer 224 at phase 405a.

According to an embodiment and taking as reference FIG. 2 and FIG. 7, the microcrystalline or nanocrystalline p-type layer 203 comprised in the microcrystalline or nanocrystalline p-i-n structure 220 of the tandem solar cell apparatus 200 is deposited on the amorphous n-type layer 225.

According to a further embodiment, the amorphous p-i-n structure 221 is produced by any technical equipment available in the state of the art.

Preferably, the amorphous p-i-n structure 221 is produced by a CVD process or a PVD process.

According to an embodiment described in FIG. 10 a method comprising depositing a heterojunction n-type crystalline layer 304a and a heterojunction i-type amorphous layer 304b between the i-type layer 104 or a heterojunction i-type layer 304 and the n-type layer 105 or a heterojunction n-type layer 305 comprising heterojunction n-type donors 315, producing a heterojunction solar cell apparatus 300). It will be appreciated that the use of the proposed new solution for solar cell architecture optimization is preferably applied to hydrogenated microcrystalline or nanocrystalline silicon hydrogenated solar cells in p-i-n configuration. However, the technical solution proposed is suitable even for p-i-n µc-Si:H of single solar cell apparatus or for tandem solar cell apparatus or for general multiple junctions (three or four junctions) comprising p-i-n a-Si:H top solar cells stacked in series with p-i-n µc-Si:H bottom solar cell. The technical solution hereby described is also applicable to solar cells with hydrogenated Si alloys including a-SiGe:H and µc-SiGe:H.

The proposed solution, which consists of co-doping the phosphorus n-doped µc-Si:H layer with oxygen in the previously discussed specific composition range, allows to increase the doping effectiveness of the phosphorus doped n-type microcrystalline silicon solar cell of the p-i-n µc-Si:H structure.

This condition thus increases the solar cell Fill Factor and improves both the amount of reflected light from the metal back layer to the intrinsic µc-Si:H absorber layer thus increasing the Jsc and the barrier to holes at the i/n interface of the p-i-n µc-Si:H junction.

Furthermore, an example of implementation applied to a tandem solar cell (alternating an amorphous and a microcrystalline p-i-n structure) using a microcrystalline n-type layer comprising oxygen with an atomic concentration of ~7% of the overall atomic composition of the n-type layer: it produces a significant improvement in the efficiency of the solar cell achieving up to a 10% increase of the solar cell output power.

The invention claimed is:

1. A heterojunction solar cell apparatus comprising:
a substrate,
a p-i-n structure disposed on the substrate, the structure comprising
  a heterojunction p-type amorphous layer arranged on
  a heterojunction first i-type amorphous layer arranged on
  a heterojunction first n-type crystalline layer arranged on
  a heterojunction second i-type amorphous layer arranged on
  a heterojunction second n-type crystalline layer,
wherein the heterojunction second n-type layer comprises an oxygen-rich amorphous silicon phase, comprising heterojunction n-type donors including phosphorus atoms, wherein the heterojunction n-type donors comprise oxygen atoms at an atomic concentration comprised between 5% and 25% of the overall atomic composition of the n-type layer, and wherein the heterojunction n-type donors comprise phosphorus atoms at an atomic concentration between 1% and 4% of the overall atomic composition of the heterojunction n-type layer.

2. The heterojunction solar cell apparatus according to claim 1, wherein the amorphous layers do not absorb light and do not generate photo-current.

3. The heterojunction solar cell apparatus according to claim 1, wherein the heterojunction n-type donors comprise oxygen atoms at an atomic concentration comprised between 7% and 12% of the overall atomic composition of the n-type layer.

4. The heterojunction solar cell apparatus according to claim 1, wherein the heterojunction second n-type crystalline layer is a nanocrystalline second n-type layer.

5. The heterojunction solar cell apparatus according to claim 1, wherein the heterojunction second n-type layer comprises hydrogen atoms.

6. The heterojunction solar cell apparatus according to claim 1, wherein the heterojunction second n-type layer has a thickness comprised between 20 and 60 nm.

7. The heterojunction solar cell apparatus according to claim 6, wherein the heterojunction second n-type layer has a thickness of 40 nm.

8. A method for forming of a heterojunction solar cell apparatus comprising:
depositing a n-type transparent conductive oxide on a substrate;
forming a p-i-n heterojunction structure including
depositing a heterojunction p-type amorphous layer on said n-type transparent conductive oxide;
depositing a heterojunction first i-type amorphous layer on said heterojunction p-type amorphous layer;
depositing a heterojunction first n-type crystalline layer on said heterojunction first i-type amorphous layer;
depositing a heterojunction second i-type amorphous layer on said heterojunction first n-type crystalline layer;
depositing a heterojunction second n-type crystalline layer on said heterojunction second i-type amorphous layer;
wherein depositing said heterojunction second n-type layer comprised in said p-i-n heterojunction structure includes depositing n-type donors including phosphorus and oxygen atoms having said oxygen atoms at an atomic concentration comprised between 5% and 25% of the overall atomic composition of the heterojunction second n-type layer, wherein the n-type donors comprise phosphorus atoms at an atomic concentration comprised between 1% and 4% of the overall atomic composition of the heterojunction second n-type layer; and, wherein the heterojunction second n-type layer comprises an oxygen-rich amorphous silicon phase.

* * * * *